United States Patent [19]

Metz et al.

[11] Patent Number: 5,452,171
[45] Date of Patent: Sep. 19, 1995

[54] ELECTROSTATIC DISCHARGE PROTECTION CIRCUIT FOR INTEGRATED CIRCUITS

[75] Inventors: Larry S. Metz; Gordon W. Motley, both of Ft. Collins, Colo.

[73] Assignee: Hewlett-Packard Company, Palo Alto, Calif.

[21] Appl. No.: 149,858

[22] Filed: Nov. 10, 1993

Related U.S. Application Data

[63] Continuation-in-part of Ser. No. 898,997, Jun. 15, 1992, Pat. No. 5,400,202.

[51] Int. Cl.[6] .............................................. H01L 29/06
[52] U.S. Cl. ....................................... 361/56; 361/91; 361/118
[58] Field of Search .................... 361/56, 91, 118, 127, 361/111

[56] References Cited

U.S. PATENT DOCUMENTS 5,077,591 12/1991 Chen et al. ...................... 357/23.13

Primary Examiner—Marc S. Hoff
Assistant Examiner—S. Jackson

[57] ABSTRACT

An ESD protection circuit that uses the well-known SCR latchup effect present in CMOS processes to divert the ESD current pulse away from sensitive circuit structures. The circuit uses an inverter trigger device, with a voltage divider on its output, to control the amount of voltage necessary to cause latchup. This feature enables the SCR to absorb a high current pulse on the CMOS pad structures caused by an ESD event, while also preventing the circuit from latching when an ordinary CMOS voltage is applied to the pad while the circuit being protected is unpowered. The circuit insures that the SCR will latch independent of breakdown effects, while also allowing the threshold voltage at which latchup occurs to be adjusted into the circuit by varying the sizes of two FETS used as the voltage divider.

14 Claims, 6 Drawing Sheets

ELECTROSTATIC DISCHARGE PROTECTION CIRCUIT FOR INTEGRATED CIRCUITS

CROSS REFERENCE TO RELATED APPLICATIONS

This application is a continuation-in-part of application Ser. No. 07/898,997, filed Jun. 15, 1992, now U.S. Pat. No. 5,400,202 entitled "Electrostatic Discharge Protection Circuit for Integrated Circuits", of Larry S. Metz.

FIELD OF THE INVENTION

This invention relates to electronic circuits and more particularly to a circuit for protecting integrated circuits from electrostatic discharge. Even more particularly, the invention relates to an electrostatic discharge protection circuit having a trigger circuit for triggering a silicon controlled rectifier (SCR) circuit which uses the SCR latchup effect present in CMOS processes to divert the electrostatic discharge current pulse away from sensitive integrated circuit structures.

BACKGROUND OF THE INVENTION

Electrostatic discharge (ESD) causes substantial damage to integrated circuits during and after the chip manufacturing process. ESD events are particularly troublesome for CMOS chips because of their low power requirements and extreme sensitivity. On-chip ESD protection circuits for CMOS chips is essential. Generally, such circuits require a high failure threshold, a small layout size and a low RC delay so as to allow high speed applications. However, such ESD protection circuits have heretofore been difficult to design.

Previously, resistors and diodes were used in CMOS ESD protection circuits, but such resistors and diodes have been gradually replaced by 3-layer devices such as field-oxide MOSFETs, gate-oxide MOSFETs and parasitic NPN or PNP bipolar junction transistors in CMOS technologies. Others have used a parasitic 4-layer PNPN device known as a silicon control rectifier to protect the chip against the damages caused by ESD events.

Due to its high current sinking/sourcing capability, very low turn-on impedance, low power dissipation, and large physical volume for heat dissipation, parasitic lateral SCR devices have been recognized in the prior art as one of the most effective elements in CMOS on-chip ESD protection circuits. However, there is a major disadvantage when using the parasitic SCR device in ESD protection circuits in that the SCR device has a high trigger voltage. To perform ESD protection, the trigger voltage of an ESD protection circuit must be less than the voltage that can damage the input buffer or output driver. The typical trigger voltage of a parasitic lateral SCR device in the ESD protection circuits fabricated by the advanced 1 μm CMOS process with highly doped drain and silicided diffusion is about 50 volts if the space from its anode to its cathode is 6 μm.

Unfortunately, with such a high trigger voltage, the lateral SCR device cannot be used as the only protection element. FIGS. 1(a) and 1(b) illustrate an ESD protection circuit having an SCR structure. FIG. 1(a) illustrates the circuit diagram, while FIG. 1(b) illustrates the corresponding substrate. The ESD protection device illustrated in FIGS. 1(a) and 1(b) includes an SCR device 10 comprising cross-coupled bipolar PNP transistor 12 and NPN transistor 14 connected between an input/output pad 15, on the integrated circuit 16 to be protected, and the chip ground (also substrate) of the integrated circuit 16. The resistance $R_s$ of the P-substrate in which the SCR 10 is formed is illustrated along with the well resistance $R_w$, which establishes a threshold current that must be reached before the SCR device 10 may be activated. As illustrated in FIGS. 1(a) and 1(b), an NMOS trigger FET 18 is further provided for lowering the triggering voltage of the SCR 10 to the breakdown voltage of the trigger FET 18.

The ESD protection circuit illustrated in FIGS. 1(a) and 1(b) thus requires that a trigger device such as NMOS trigger FET 18 be subjected to junction breakdown conditions before the SCR 10 may be activated. In particular, enough current must flow through the NMOS trigger FET 18 to initiate latchup by the SCR device 10. However, since the circuitry 16 being protected can also experience junction breakdown, there is no mechanism in the circuit of FIG. 1 to ensure that enough current will flow through the NMOS trigger FET 18 to initiate latchup. Furthermore, there is no assurance that device breakdown effects such as bipolar snapback will result in all the ESD current being absorbed by the ESD protection circuitry rather than the output circuit.

During operation of the circuit of FIG. 1, the NMOS trigger FET 18 operates in the junction breakdown condition to pull current through the well resistor $R_w$. This breakdown voltage is approximately equal to the breakdown voltage of the circuitry to be protected, and, as just noted, it is impossible in such a circuit to ensure that the circuitry 16 to be protected will not conduct significant amounts of current due to device breakdown. It is also not possible to ensure that the circuitry 16 to be protected will not "steal" the current from the SCR device 10, thereby inhibiting the SCR 10 from latching up and absorbing the majority of the ESD event energy. FIG. 1 also shows a fixed resistor 17 used to limit current into the circuit to be protected. This fixed resistor has the disadvantage that it must be of a high value to prevent damage in a discharge event, but it must be of a low value to allow the circuit to properly drive a signal to the pad.

FIGS. 2(a) and 2(b) illustrate an ESD protection circuit of the type illustrated in FIG. 1 except that an NMOS FET 20 is added for lowering the breakdown voltage by floating the gate of NMOS trigger 18 when chip power $V_{DD}$ is low. FIG. 2(a) illustrates the circuit diagram, while FIG. 2(b) illustrates the corresponding substrate. As illustrated, the NMOS FET 20 is responsive to $V_{DD}$ to float the gate of the NMOS trigger FET 18 when the circuitry 16 to be protected is not powered up. Once powered up ($V_{DD}$ goes high) the gate of the trigger FET 18 is grounded so as to raise the breakdown voltage of trigger FET 18, thus minimizing the effect of the protection circuitry on the operation of the circuitry 16 to be protected. However, in the circuitry of FIGS. 2(a) and 2(b), latching by the SCR device 10 still relies upon the breakdown of the NMOS trigger FET 18 for initiation of latchup and is still susceptible to current "stealing" by the circuitry 16, which will also have floating gates. Thus, the aforementioned problems have not been overcome by the circuit of FIG. 2.

There is need in the art then for an ESD protection circuit which will enable the SCR to latch independent of the breakdown effects of the NMOS trigger FET. There is further need in the art for such a circuit that provides control over the amount of voltage necessary to initiate SCR latchup. The present invention meets these and other needs.

SUMMARY OF THE INVENTION

It is an aspect of the present invention to provide a circuit that diverts an electrostatic discharge current pulse away from sensitive integrated circuit structures.

It is another aspect of the invention to provide such a circuit wherein the threshold voltage of such a discharge can be adjusted during fabrication of the integrated circuit to allow use in different applications.

The above and other aspects of the invention are accomplished by providing an ESD protection circuit that uses the well-known SCR latchup effect present in CMOS processes to divert the ESD current pulse away from sensitive circuit structures. In preferred embodiments, this is accomplished using an inverter trigger device, with an output voltage divider, that is responsive to an ESD event on the input/output pad of the integrated circuit being protected. This feature of the invention enables the SCR to absorb a high current pulse on the CMOS pad structures caused by an ESD event, while also preventing the circuit from latching when an ordinary CMOS voltage is applied to the pad while the circuit being protected is unpowered.

The ESD protection circuit of the invention insures that the SCR will latch independent of breakdown effects so as to protect the integrated circuits from and ESD event at input/output pads connected to the integrated circuits, while also allowing adjustment of the threshold voltage at which latchup occurs. This adjustment is performed by varying the sizes of two FETS used as the voltage divider.

The ESD protection circuit also provides a well resistor formed between the pad and the circuit to be protected, which provides additional protection. Because the well resistor forms a diode with the substrate, a depletion region will be formed during an ESD event, and this depletion region increases the resistance of the well resistor to provide additional protection for the circuit.

BRIEF DESCRIPTION OF THE DRAWINGS

The above and other aspects, features, and advantages of the invention will be better understood by reading the following more particular description of the invention, presented in conjunction with the following drawings, wherein.

DESCRIPTION OF THE PREFERRED EMBODIMENT

Figure 1A:
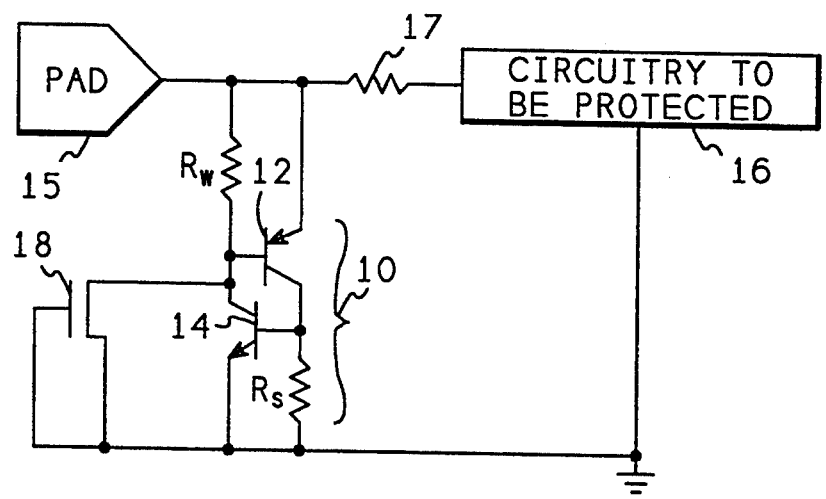
FIGS. 1(a) and 1(b) show a prior art ESD protection circuit comprising an SCR which is triggered by the junction breakdown of an NMOS trigger FET.

The following description is of the best presently contemplated mode of carrying out the present invention. This description is not to be taken in a limiting sense but is made merely for the purpose of describing the general principles of the invention. The scope of the invention should be determined by referencing the appended claims.

FIGS. 3 and 4 show an electrical discharge protection circuit for protecting integrated circuits in accordance with the techniques of the invention. In each of the Figures, part (a) illustrates the circuit diagram while part (b) illustrates the corresponding substrate. In addition, the illustrated FETs are given width/length values in the drawings which correspond to the sizes of these elements in a preferred embodiment. However, it will be appreciated by those of ordinary skill in the art that FETs of other sizes may be used and that the description given herein with respect to those Figures is for exemplary purposes only and thus, not intended in any way to limit the scope of the invention.

Figure 1B:
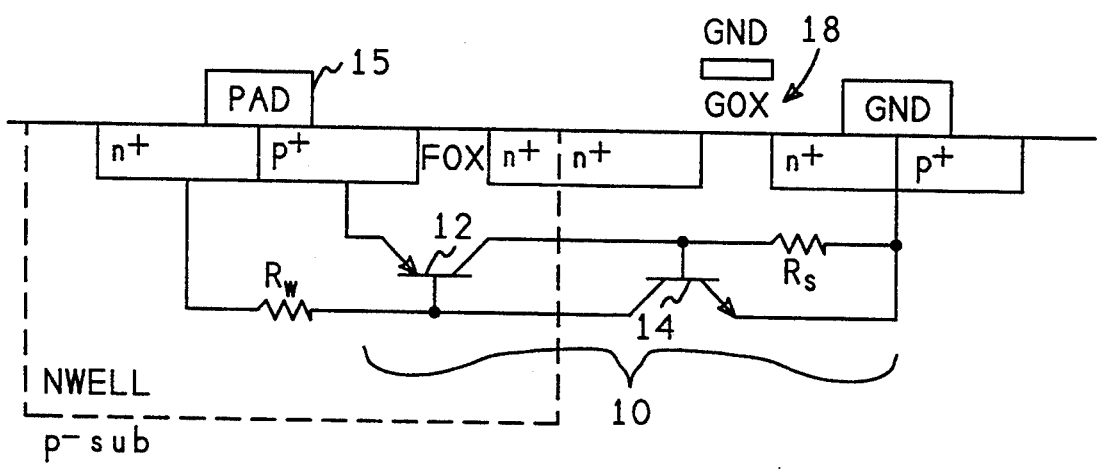
Figure 2A:
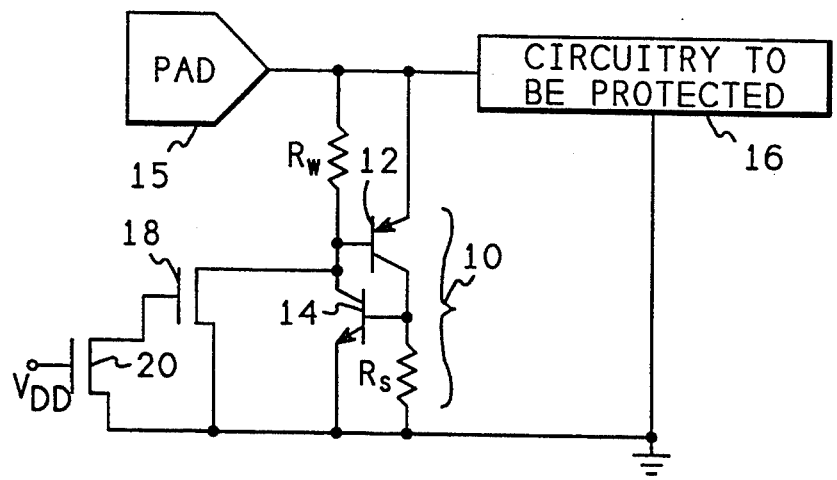
FIGS. 2(a) and 2(b) show a prior art ESD protection circuit comprising an SCR which is triggered by the junction breakdown of an NMOS trigger FET having a floating gate.
Figure 2B:
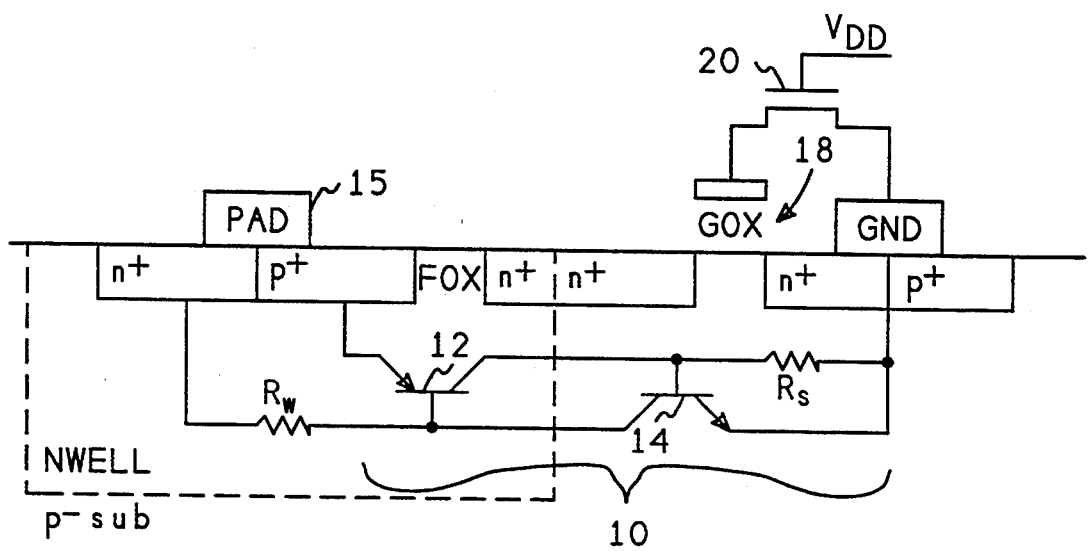
Figure 3A:
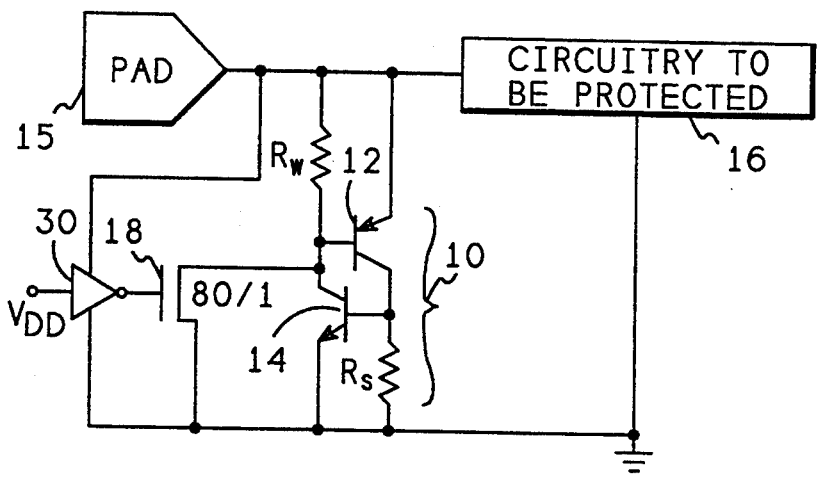
FIGS. 3(a) and 3(b) show an ESD protection circuit in accordance with the invention comprising an SCR with an inverter trigger responsive to an ESD event on the input/output pad.
Figure 3B:
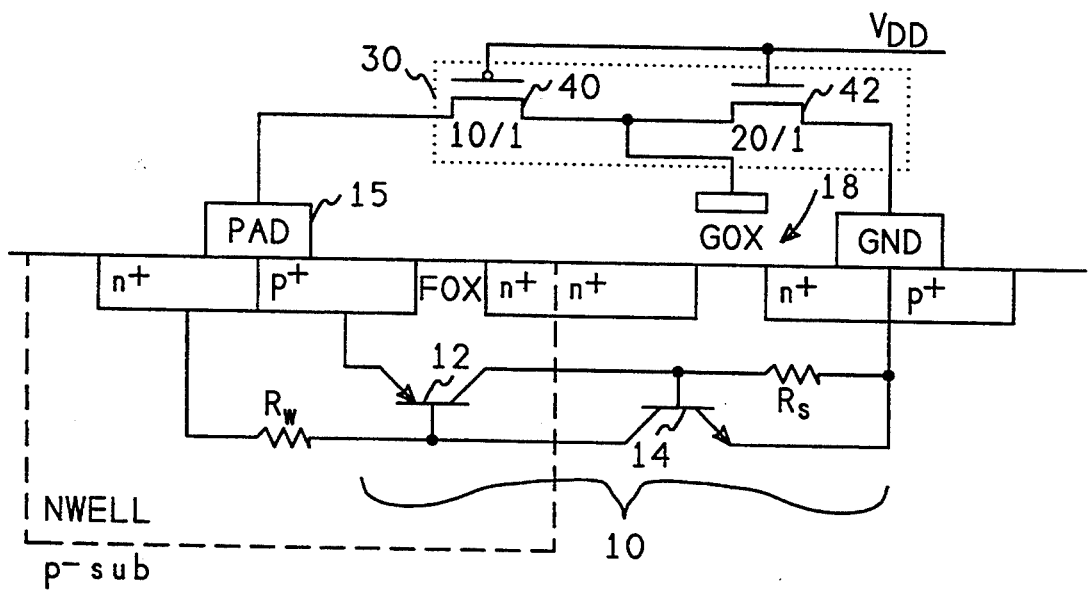

FIGS. 3(a) and 3(b) illustrate an ESD protection circuit comprising an SCR with inverter trigger. This embodiment differs from that of prior art FIG. 1 in that a trigger circuit is provided comprising an NMOS trigger FET 18 and an inverter 30 which drives the gate of the NMOS trigger FET 18 in response to an ESD even at the input/output pad 15. Inverter 30 receives its power from the input/output pad 15, which is powered by the ESD event. The signal into the inverter 30, $V_{DD}$, is the chip global positive power supply, while the ground is the chip substrate.

FIG. 3(b) illustrates that the inverter 30 comprises a PFET 40 and an NFET 42 connected in series between the pad 15 and circuit ground. $V_{DD}$ is connected to the gate of both the FETs and the output comes from the connection between the two FETs. This output is connected to the gate of NMOS trigger FET 18.

During as ESD event, the chip global power supply $V_{DD}$ is at ground, therefore, the gates of PFET 40 and NFET 42 are both connected to ground. As the electrostatic discharge into the input/output pad 15 progresses, the voltage on the input/output pad 15 rises and as it reaches approximately 2 volts it causes PFET 40 to start conducting, therefore, the source of PFET 40 also rises to approximately 2 volts and this voltage, which is connected to the gate of NMOS trigger FET 18, causes NMOS trigger FET 18 to conduct which causes the SCR to latch.

Under certain conditions, however, this latching can occur to cause an undesirable side effect. For example, where two integrated circuit devices are interconnected, and a CMOS output connection from the first integrated circuit device is connected to input/output pad 15 contained in the second integrated circuit device, a problem occurs if the first device is powered up and the second device is not powered up. When the second device is not powered up, $V_{DD}$ will be at zero volts, however, the connection from the first device, connected to input/output pad 15, may be at 5 volts, since it is connected to an output of a powered up device (the first device), and 5 volts is a normal voltage for the output of a powered up device. In this condition, if the first device supplies sufficient current, SCR 10 will latchup. Therefore, if the second device is subsequently powered up, the circuit can remain latched and operate incorrectly. Thus, it can be seen that while a very low trigger voltage of 2 volts is desirable when the circuit is unconnected, it may be too low for the circuit when connected to a device with a separate $V_{DD}$.

Figure 4A:
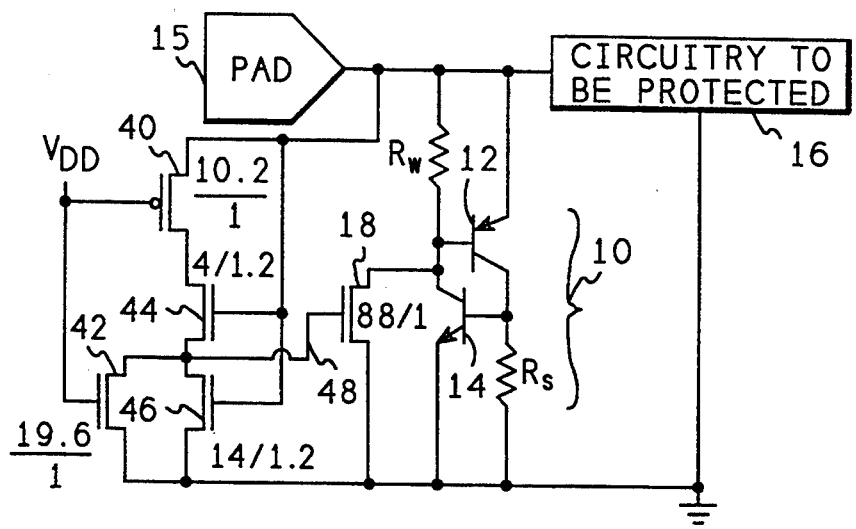
FIGS. 4(a) and 4(b) show an ESD protection circuit in accordance with the invention comprising an SCR with an inverter trigger responsive to and ESD event and further comprising a voltage divider circuit on the output of the inverter trigger.

FIG. 4 shows the circuit of the preferred embodiment of the present invention which overcomes the undesirable side effect of the circuit of FIG. 3 by allowing the trigger voltage to be adjusted during the fabrication of the integrated circuit. Referring now to FIG. 4(a), the inverter 30 from FIG. 3 is shown comprising the PFET 40 and the NFET 42. A pair of NFETs 44 and 46 form a voltage divider between the source of PFET 40 and circuit ground. By adjusting the sizes of the NFETs 44 and 46, the trigger voltage output 48, between the source of NFET 44 and the drain of NFET 46, can be adjusted to a higher voltage. The NFETs 44 and 46 could be designed, for example, to require 7 volts on the pad 15 in order to produce a trigger voltage output 48 large enough to cause the SCR to latch, thus preventing the above described undesirable side effect between two connected devices with separate $V_{DD}$s.

In operation, if the circuit of FIG. 4 is not powered up, $V_{DD}$ is at zero volts. During an ESD event, the electrostatic discharge into the input/output pad 15 progresses, the voltage on the input/output pad rises so as to turn on PFET 40. As discussed above, this turn-on can occur as low as approximately 1 volt. The source of PFET 40, however, is connected to circuit ground through the voltage divider comprising NFET 44 and NFET 46. NFET 42 will be cut off since its gate is connected to $V_{DD}$. Thus, as the source of PFET 40 rises to above one volt when PFET 40 turns on, the output 48 will be lower than the source of FET 10, because of the effect of the voltage divider formed by NFET 44 and NFET 46. As the voltage on input/output pad 15 continues to rise, at some voltage determined by the sizes of NFET 44 and NFET 46, the voltage on signal 48 will rise to a level sufficient to turn NMOS trigger FET 18 on, which causes the SCR 10 to latch.

If the sizes of NFET 44 and NFET 46 are selected such that the voltage on input/output pad 15 must be 7 volts or higher before the latchup occurs, the undesirable side effect described above, wherein a first device is powered up and a second device is not powered up, will not cause a trigger event. As described above, if the first device is powered up, the voltage on pad 15 will only be 5 volts, and because of the voltage divider circuit formed by NFET 44 and NFET 46, the voltage on signal 48 will be too low to cause NMOS trigger FET 18 to turn on.

Once the circuit of FIG. 4(a) is powered up, $V_{DD}$ goes to 5 volts which causes NFET 42 to turn on and ground the voltage on signal on 48, to prevent any later latchup. Thus, it can be seen that the voltage divider circuit formed by NFET 44 and NFET 46 allows the trigger voltage to be adjusted wherein the voltage can be adjusted high enough to prevent unwanted trigger events, yet still remain low enough to cause the SCR 10 to trigger in an actual ESD discharge event. Furthermore, the circuit of the present invention provides a positive control of the trigger voltage rather than depending upon junction breakdown conditions as in the prior art.

Although the circuit of FIG. 4 is shown using NFETs for the voltage divider, those of ordinary skill in the art will recognize that PFETs could also be used, as could resistors formed within the integrated circuit.

Figure 4B:
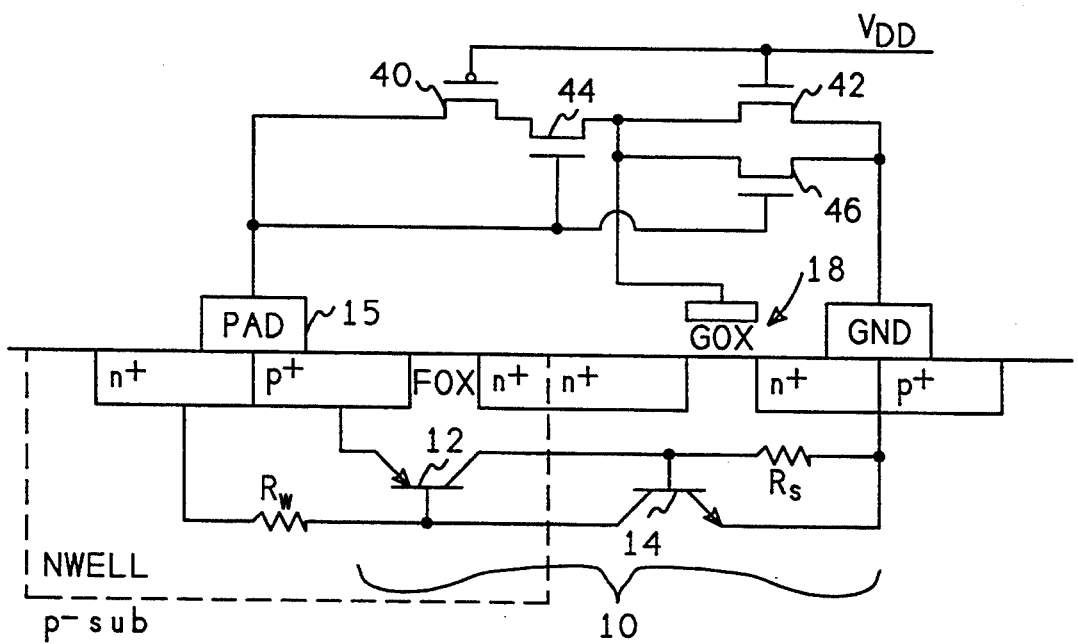
Figure 5A:
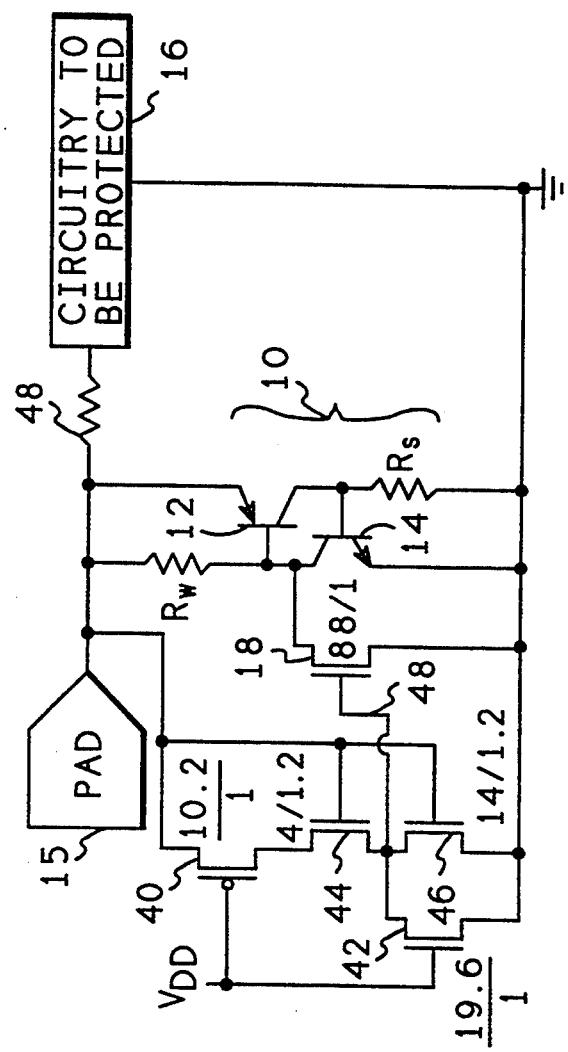
FIGS. 5(a) and 5(b) show an ESD protection circuit in accordance with a the invention comprising an SCR with an inverter trigger responsive to an ESD event and further comprising a well resistor between the protection circuitry and the circuit being protected.
Figure 5B:
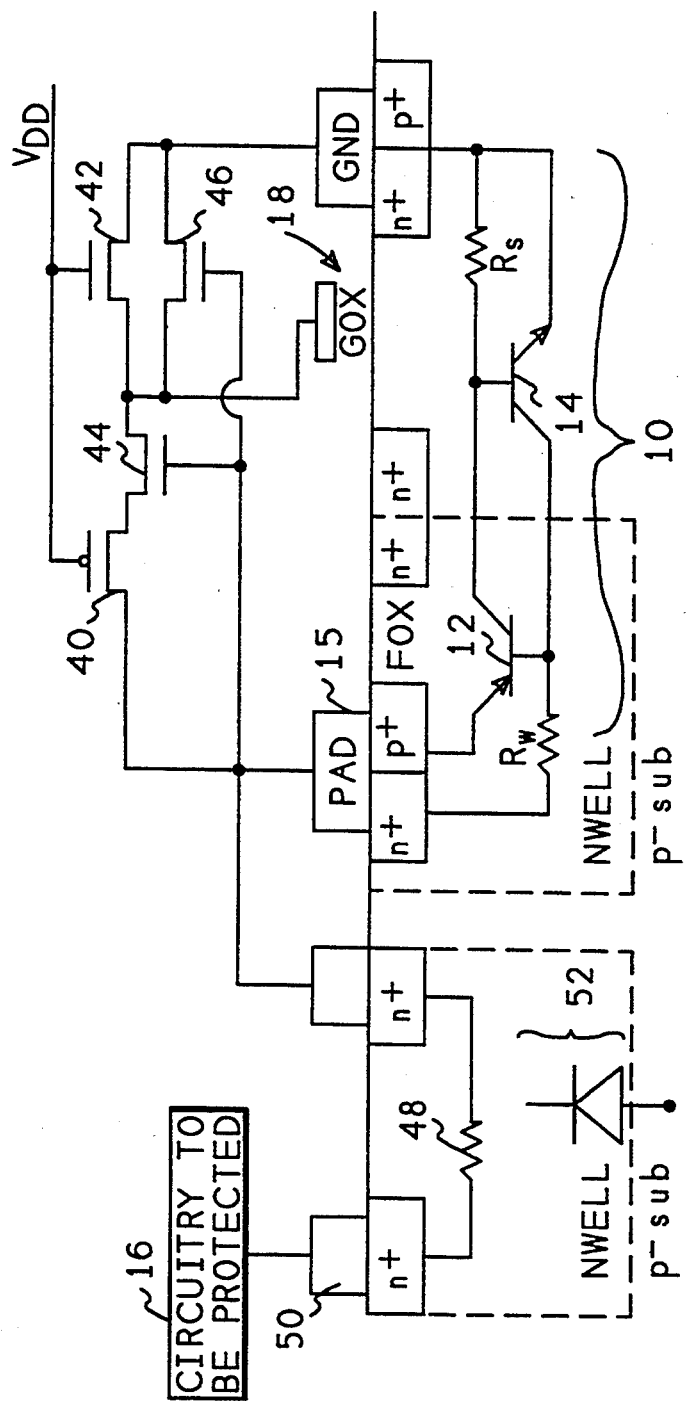

FIGS. 5(a) and 5(b) show the circuit of FIGS. 4(a) and 4(b), respectively, and further show a well resistor 48. The well resistor 48 provides additional protection for the circuit 16, but operates significantly different from the fixed resistor 17, shown above in FIG. 1.

As shown in FIG. 5(b), the well resistor 48 is formed by an n-well within the substrate, thus it is made of semiconductor material. Because the well resistor 48 is made of n-type semiconductor material, and it is constructed within the p-substrate, a diode 52 exists between these two types of material. When an ESD event occurs, voltage will build on the pad 15, and this voltage will reverse bias diode 52. Because of the reverse bias, diode 52 will form a depletion region, and the size of this depletion region will be dependent upon the ESD voltage. As the ESD voltage increases, the depletion region gets larger, which increases the resistance of the well resistor 48. As the ESD voltage continues to increase, the depletion region will become so large as to "pinch off" the well resistor, limiting current flow into the circuity to be protected 16, thus providing additional protection.

During normal operation, the normal signal voltages on pad 15 are low enough to keep the depletion region very small, thus providing a low resistance to signal flow through the pad 15.

Therefore, under normal operation, the well resistor 48 is a very small resistance allowing signals to flow through the pad 15. During an ESD event, however, when the voltage on pad 15 increases far beyond normal operating voltages, the well resistor becomes a higher value and eventually limits the current flow into the circuit to be protected 16 to provide additional protection.

The well resistor could also be added to the circuit of FIGS. 3(a) and 3(b) to provide protection in the same manner as discussed above with respect to FIGS. 4(a) and 4(b).

Having thus described a presently preferred embodiment of the present invention, it will now be appreciated that the aspects of the invention have been fully achieved, and it will be understood by those skilled in the art that many changes in construction and circuitry and widely differing embodiments and applications of the invention will suggest themselves without departing from the spirit and scope of the present invention. The disclosures and the description herein are intended to be illustrative and are not in any sense limiting of the invention, more preferably defined in scope by the following claims.

What is claimed is:

1. An electrostatic discharge (ESD) protection circuit for protecting an integrated circuit from an ESD event at an input/output pad connected to said integrated circuit, said ESD protection circuit comprising:

a silicon controlled rectifier (SCR) circuit connected between said input/output pad and a device ground of said integrated circuit for absorbing current created by said ESD event at said input/output pad; and a triggering device for triggering said SCR circuit to absorb said current created by said ESD event, said triggering device comprising a trigger FET for activating said SCR circuit and an adjustable threshold device responsive to said ESD event at said input/output pad for applying a trigger voltage to a gate of said trigger FET so as to activate said SCR circuit upon receipt of said ESD event at said input/output pad independent of a junction breakdown of said trigger FET.

2. The circuit of claim 1 further comprising a well resistor formed between said input/output pad and circuitry being protected within said integrated circuit.

3. The circuit of claim 1 wherein said adjustable threshold device comprises:
   a FET powered by said ESD event for conducting an ESD voltage to an FET output;
   a voltage divider connected between said FET output and circuit ground and further having a voltage reduced output connected to a gate of said trigger FET wherein a voltage input to said FET is reduced by said voltage divider before being applied to said gate of said trigger FET.

4. The circuit of claim 3 further comprising a FET for grounding said voltage reduced output when power is being applied to said integrated circuit.

5. The circuit of claim 3 wherein said voltage divider comprises a pair of FETs connected in series.

6. The circuit of claim 5 wherein said pair of FETs connected in series comprises NFETs.

7. The circuit of claim 5 wherein said pair of FETs connected in series comprises PFETs.

8. The circuit of claim 1 wherein said adjustable threshold device comprises
   an inverter powered by said ESD event at said input/output pad; and
   a voltage divider having an input connected to an output of said inverter and having an output connected to said gate of said trigger FET, wherein a voltage output by said inverter is reduced before being applied to said gate of said trigger FET.

9. The circuit of claim 8 wherein said voltage divider comprises a pair of FETs connected in series.

10. The circuit of claim 8 further comprising a FET for grounding said output of said voltage divider when power is being applied to said integrated circuit.

11. An electrostatic discharge (ESD) protection circuit for protecting an integrated circuit from an ESD event at an input/output pad connected to said integrated circuit, said ESD protection circuit comprising:
    a silicon controlled rectifier (SCR) circuit connected between said input/output pad and a device ground of said integrated circuit for absorbing current created by said ESD event at said input/output pad; and
    a trigger device for triggering said SCR circuit to absorb said current created by said ESD event, comprising
    a trigger FET connected to activate said SCR circuit,
    a FET powered by said ESD event for conducting an ESD voltage to a FET output, and
    a voltage divider connected between said FET output and circuit ground and further having a voltage reduced output connected to a gate of said trigger FET wherein a voltage input to said FET is reduced by said voltage divider before being applied to said gate of said trigger FET.

12. The circuit of claim 11 further comprising a FET for grounding said voltage reduced output when power is being applied to said integrated circuit.

13. The circuit of claim 11 wherein said voltage divider comprises a pair of FETs connected in series.

14. The circuit of claim 11 further comprising a well resistor formed between said input/output pad and circuitry being protected within said integrated circuit.

* * * * *